United States Patent

Sakurai et al.

[11] Patent Number: 6,022,611
[45] Date of Patent: Feb. 8, 2000

[54] CIRCUIT BOARD AND METHOD FOR MANUFACTURING SAME

[75] Inventors: Shizuo Sakurai; Shinji Araki; Sakae Shinkawa, all of Toyama-ken, Japan; Tadahiko Nakagaki, Jurong, Singapore

[73] Assignee: Hokuriku Electric Industry Co., Ltd.

[21] Appl. No.: 08/862,856

[22] Filed: May 23, 1997

[30] Foreign Application Priority Data

May 24, 1996 [JP] Japan ................................. 8-129643
May 9, 1997 [JP] Japan ................................. 9-119736

[51] Int. Cl.$^7$ .............................. B32B 3/00; B32B 23/02
[52] U.S. Cl. ........................................ 428/209; 428/192
[58] Field of Search ................................ 428/209, 901, 428/192

[56] References Cited

U.S. PATENT DOCUMENTS

| | | | |
|---|---|---|---|
| 4,029,845 | 6/1977 | Nomura | 428/415 |
| 4,486,505 | 12/1984 | Fushiki et al. | 428/416 |
| 4,578,308 | 3/1986 | Hani et al. | 428/297 |
| 5,131,141 | 7/1992 | Kawaguchi | 428/901 |
| 5,346,750 | 9/1994 | Hatakeyama et al. | 428/209 |

FOREIGN PATENT DOCUMENTS

| | | |
|---|---|---|
| 24109 | of 1967 | Japan . |
| 88079 | of 1974 | Japan . |
| 9755 | of 1975 | Japan . |
| 40560 | of 1976 | Japan . |
| 52857 | of 1976 | Japan . |
| 50560 | of 1977 | Japan . |
| 59860 | of 1977 | Japan . |
| 97895 | of 1977 | Japan . |
| 102097 | of 1982 | Japan . |

*Primary Examiner*—Deborah Jones
*Assistant Examiner*—Cathy F. Lam
*Attorney, Agent, or Firm*—Rankin, Hill, Porter & Clark LLP; Carl A. Rankin

[57] ABSTRACT

A circuit board capable of accomplishing an increase in current capacity and therefore a reduction in resistance of a through-hole conductive section each formed by filling a conductive paste in each of through-holes formed in a paper base insulating substrate by punching. A punching pin is thrust into the paper base insulating substrate provided on front and rear surfaces thereof with copper foil lands from a side of the front surface, resulting in the through-holes being formed. A drawing pin is inserted into each of the through-holes from a side of the rear surface of the insulating substrate through a rear opening of the through-hole, to thereby curve an inner peripheral portion of the rear copper foil land toward an interior of the through-hole and cut off any swell in the through-hole. The through-holes each are filled with the conductive paste, followed by curing the paste, so that the through-hole conductive section is formed for electrically connecting copper foil lands to each other.

5 Claims, 4 Drawing Sheets

Fig. 5
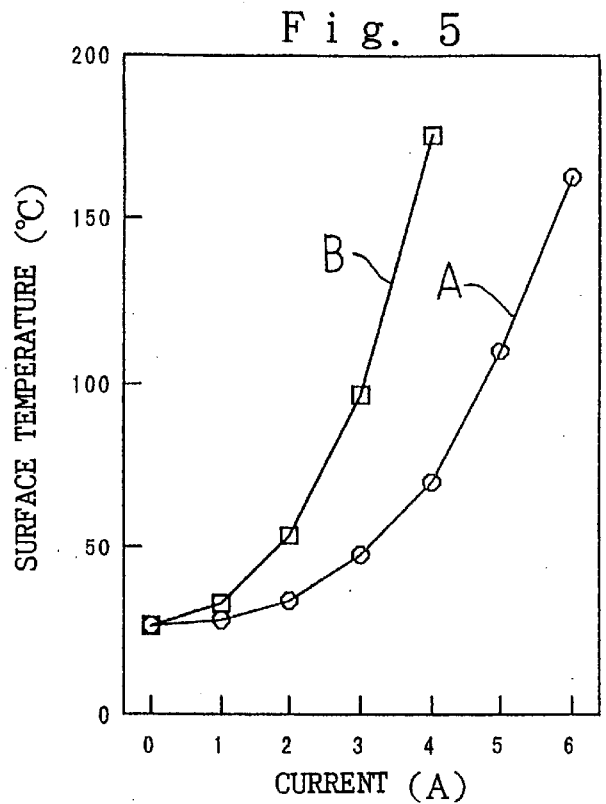
Fig. 7A
Fig. 7B
Fig. 7C
Fig. 8A
PRIOR ART
Fig. 8B
PRIOR ART
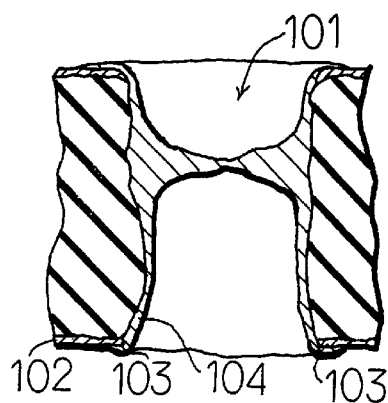
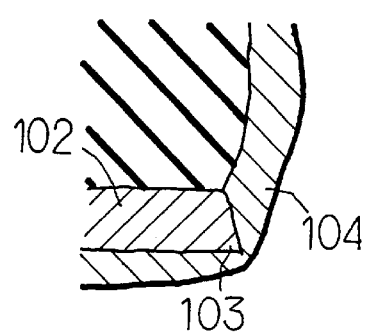

CIRCUIT BOARD AND METHOD FOR MANUFACTURING SAME

BACKGROUND OF THE INVENTION

This invention relates to circuit board techniques, and more particularly to a circuit board including through-holes formed by punching using a punching pin and a through-hole conductive section formed by filling each of the through-holes with a conductive paste and a method for manufacturing the same.

An increase in current flowing through a circuit on a circuit board requires an increase in width of a circuit pattern, as well as an increase in current capacity of each of through-hole conductive sections or a reduction in electrical resistance of each through-hole conductive section. In a conventional circuit board, the through-hole conductive section increased in current capacity is formed by plating. For example, Japanese Patent Publication No. 24109/1967, Japanese Patent Application Laid-Open Publication No. 88079/1974, Japanese Patent Application Laid-Open Publication No. 9755/1975, Japanese Patent Application Laid-Open Publication No. 40560/1976, Japanese Utility Model Application Laid-Open Publication No. 52857/1976, Japanese Patent Application Laid-Open Publication No. 50560/1977, Japanese Patent Application Laid-Open Publication No. 59860/1977 and Japanese Patent Application Laid-Open Publication No. 97895/1983 each disclose techniques of forming through-hole conductive sections increased in current capacity by plating. Such formation of the through-hole conductive section by plating causes plating liquid to be impregnated in an insulating substrate of a circuit board, leading to a deterioration in strength of the insulating substrate. In order to avoid the problem, the insulating substrate is conventionally made of a glass-epoxy material, a composite material consisting of glass and resin fiber, or the like. Unfortunately, such a material for the insulating substrate is expensive, resulting in the conventional circuit board provided with the through-hole conductive sections increased in current capacity being significantly increased in cost.

Conventionally, an insulating substrate reduced in cost may be provided in the form of a paper base insulating substrate made by impregnating a paper base material with a thermosetting insulating resin material such as phenol resin or the like. Unfortunately, such a paper base insulating substrate causes plating liquid to be impregnated in the paper base material, leading to a failure in formation of the through-hole conductive sections by plating. In view of the fact, in a circuit board formed of such a paper base insulating substrate and provided with the through-hole conductive sections, the through-hole conductive sections each are conventionally formed of a conductive paste. More particularly, first the paper base material is impregnated with thermosetting insulating resin to provide the insulating substrate, which is formed on both surfaces thereof with a copper foil by cladding to prepare a copper-clad insulating substrate. Then, the insulating substrate is thrust from a side of a front surface thereof by a punching pin, to thereby be formed with through-holes. Subsequently, a conductive paste prepared by adding a conductive powder material to thermosetting insulating resin is filled in the through-holes by printing and then cured, so that the through-hole conductive sections may be provided.

However, as noted in the art, the through-hole conductive sections thus formed by filling the through-holes with the conductive paste each are reduced in current capacity as compared with the through-hole conductive section formed by plating. More particularly, the former through-hole conductive section is increased in resistance as compared with the latter one. Thus, in the circuit board increased in current capacity requires, it is required to form each of the through-hole conductive sections using an expensive insulating substrate such as a glass-epoxy substrate and by plating.

A reduction in cost of the circuit board has been increasingly demanded. Unfortunately, the circuit board formed with the through-hole conductive section by plating fails to satisfy the demand.

SUMMARY OF THE INVENTION

The present invention has been made in view of the foregoing disadvantage of the prior art.

Accordingly, it is an object of the present invention to provide a circuit board which includes through-hole conductive sections formed by filling a conductive paste in through-holes formed in a paper base insulating substrate by punching while being provided with an increased current capacity or a decreased resistance.

It is another object of the present invention to provide a circuit board which is capable of being reduced in cost while being increased in current capacity.

It is a further object of the present invention to provide a method for manufacturing a circuit board which is capable of providing a circuit board attaining the above-described objects.

It is still another object of the present invention to provide a method for manufacturing a circuit board which is capable of readily manufacturing a circuit board decreased in resistance of through-hole conductive sections while reducing a cost thereof.

It is yet another object of the present invention to provide a method for manufacturing a circuit board which is capable of concurrently carrying out a shaving step and a curve forming step in formation of through-hole conductive sections, to thereby reduce the number of steps required for the formation.

In accordance with the present invention, a circuit board is provided. The circuit board includes an insulating substrate made by impregnating a paper base material with thermosetting insulating resin and curing the thermosetting insulating resin. The insulating substrate is formed on front and rear surfaces thereof with a front copper foil circuit and a rear copper foil circuit, respectively. The insulating substrate is formed with through-holes by punching. More particularly, the through-holes each are formed by thrusting a punching pin into the insulating substrate from a side of the front surface of the insulating substrate. The through-hole is formed in a manner to extend through the insulating substrate, as well as a front copper foil land and a rear copper foil land respectively incorporated in the front copper foil circuit and rear copper foil circuit and arranged so as to be opposite to each other with the insulating substrate being interposed therebetween. Also, the circuit board includes through-hole conductive sections each of which has both ends respectively superposed on a pair of the front copper foil land and rear copper foil land, as well as a connection for connecting both ends to each other formed along the through-hole. The through-hole conductive section is formed of a conductive paste. An inner peripheral portion of the rear copper foil land surrounding a rear opening of each of the through-holes is subject to curving or curve processing, to thereby be directed into the through-hole while compressedly deforming a portion of the insulating substrate positioned around the rear opening of the through-hole.

The inventors initially considered that an increase in resistance or a reduction in current capacity of the through-hole conductive section formed using a conductive paste is caused due to a resistance of the conductive paste. Thus, initially the inventors attempted to decrease a resistance of the conductive paste, to thereby reduce a resistance of the through-hole conductive section. However, it was found that a reduction in resistance of the conductive paste fails to sufficiently reduce a resistance of the through-hole conductive section. Also, it was found that the through-hole conductive section thus formed is substantially varied in resistance. As a result of considering the causes, it was found that the failure and variation are caused due to a configuration of the inner peripheral portion of the copper foil land surrounding one of the openings of the through-hole formed by punching. More particularly, as shown in FIGS. 8A and 8B, punching carried out for forming through-holes causes a portion of a copper foil positioned around a rear opening of each of the through-holes or an inner peripheral portion of a rear copper foil land 102 to be outwardly turned up to form a relatively sharp edge 103. The sharp edge 103 causes a decrease in thickness of a conductive paste 104. A portion of the conductive paste 104 which is decreased in thickness causes both an increase in resistance of each of through-hole conductive sections and a variation in resistance thereof.

In view of the above, in the present invention, curving or curve processing is carried out for curving the inner peripheral portion of the rear copper foil land toward an interior of each of the through-holes while deforming the portion of the insulating substrate positioned around the rear opening of the through-hole. Such curving eliminates formation of the above-described edge at the inner peripheral portion of the rear copper foil land encountered in the conventional circuit board, resulting in preventing a decrease in thickness of the conductive paste, leading to both a reduction in resistance of the through-hole conductive section and a variation in resistance thereof. In order to approach a current capacity of the through-hole conductive section in the present invention to that of the through-hole conductive section formed by plating as much as possible, the conductive paste preferably has a specific resistance of $6 \times 10^{-5}$ $\Omega$cm or less.

Various resin materials may be used as the thermosetting insulating resin impregnated in the paper base material for the insulating substrate. Phenolic resin is preferably used for this purpose in view of a reduced cost thereof. This permits the circuit board to be substantially reduced in cost. A degree of curving of the copper foil depends on a thickness of the copper foil. In order to reduce a resistance of the through-hole conductive section, it is required to curve the copper foil as smoothly as possible. Thus, in the present invention, the copper foil preferably has a thickness of 30 $\mu$m or more.

The copper foil through which the punching pin is thrust into the insulating substrate is naturally curved by the punching pin. However, when the punching pin is removed from the through-hole, contact of the punching pin with the copper foil or breakage of a distal end of the punching pin causes any edge to be often formed at the copper foil. In order to eliminate such a problem to increase yields of the circuit board, the inner peripheral portion of the front copper foil land surrounding the front opening of the through-hole is preferably subject to curving.

In accordance with another aspect of the present invention, a method for manufacturing a circuit board is provided. The method includes a copper-clad insulating substrate providing step of providing a copper-clad insulating substrate consisting of an insulating substrate and a copper foil provided on each of both front and rear sufaces of the insulating substrate. The insulating substrate is formed by impregnating a paper base material with thermosetting insulating resin and curing the thermosetting insulating resin. The method further includes a through-hole forming step of thrusting a punching pin into the copper-clad insulating substrate from a side of the front surface of the insulating substrate to form through-holes extending through the insulating substrate and the copper foil formed on each of the front and rear surfaces of the insulating substrate. Also, the method includes a drawing pin providing step of providing a drawing pin which is provided at a distal end portion thereof with an abutment formed so as to be continuous in a circumferential direction thereof and has a diameter decreased from a maximum diameter portion thereof having a diameter larger than that of the through-holes to a distal end thereof; a shaving step of cutting off any swell formed on a surface of the insulating substrate defining each of the through-holes to shape each through-hole; a curve forming step of inserting the distal end portion of the drawing pin from a side of the rear surface of the copper-clad insulating substrate through a rear opening of each of the through-holes into each through-hole to curve a portion of the copper foil positioned around the rear opening of each through-hole; a conductive paste filling step of filling each of the through-holes with a conductive paste and applying the conductive paste onto a portion of the copper foil positioned around each of a front opening of each through-hole and the rear opening thereof; and a curing step of curing the conductive paste.

Thus, the method permits the copper foil joined to the front surface of the insulating substrate to be curved along the through-hole while deforming the through-hole, so that the circuit board may be readily manufactured while reducing a resistance of the through-hole conductive section.

In a preferred embodiment of the present invention, the curve forming step may further include a step of inserting an additional drawing pin into the front opening of each of the through-holes from a side of the rear surface of the copper-clad insulating substrate to curve a portion of the copper foil positioned around the front opening of each through-hole. Both drawing pins may be separately inserted into the through-hole. Alternatively, they may be concurrently inserted thereinto. This causes a material of the insulating substrate to be concurrently forced toward a center of the through-hole, to thereby prevent the material from deteriorating tightness between the curved copper foil and the through-hole.

The drawing pin may be formed at the distal end portion thereof with any suitable configuration such as a conical shape, a frust-conical shape or the like so long as it is provided with the abutment. The abutment may be formed into any suitable configuration in section such as a linear shape, an arcuate shape or the like. A portion of the drawing pin forwardly extending from the abutment may be formed into any suitable shape so long as it permits the drawing pin to be inserted into the through-hole. Also, when a pair of the drawing pins are concurrently inserted into the through-hole in directions opposite to each other, the drawing pins may be formed into a length which prevents both pins from abutting against each other in the through-hole.

In a preferred embodiment of the present invention, the shaving step and curve forming step may be concurrently carried out. This reduces the number of steps in the manufacturing. In this instance, the abutment of the drawing pin may be provided at a distal end thereof with a swell cutting portion for cutting off the swell.

In accordance with this aspect of the present invention, a method for manufacturing a circuit board is provided. The method includes the steps of laminating a copper foil through an adhesive layer on a paper base material impregnated with thermosetting resin capable of stopping progress of curing thereof at a B stage or a semi-cured stage, to thereby prepare a laminate material; heating the laminate material while pressurizing the laminate material in a direction of lamination thereof and interrupting heating and pressurizing of the laminate material at a stage of curing of the thermosetting resin which permits etching of the copper foil, resulting in preparing a laminate structure; subjecting the laminate structure to punching to form the laminate structure with through-holes; shaving any swell formed on a surface of the laminate structure defining each of the through-holes; providing drawing pins each provided at a distal end portion thereof with an abutment formed so as to be continuous in a circumferential direction thereof and having a diameter decreased from a maximum diameter portion thereof having a diameter larger than that of the through-holes to a distal end thereof and concurrently inserting the drawing pins from both surface sides of the insulating substrate through openings of both ends of each of the through-holes into each through-hole, to thereby curve a portion of the copper foil positioned around each of the openings of each through-hole toward each through-hole; filling each of the through-holes with a conductive paste and applying the conductive paste onto a portion of the copper foil positioned around each of the openings of each through-hole; and a curing step of heating the conductive paste to cure it.

In accordance with the present invention, punching and curving are carried out while the thermosetting resin is at B stage. If punching and curving are performed before completion of the progress of curing at B stage, which is just prior to C stage, the insulating substrate can avoid being cracked as the insulating substrate still has slight elasticity. Thus, for the substrate formed with a number of through-holes adjacent with each other, the pitch of the through-holes can be decreased. The prevention of cracking can reduce migration when silver paint is used as the conductive paste.

In a preferred embodiment of the present invention, the conductive paste comprises a silver paint having a curing temperature equal to or higher than that of the thermosetting resin.

In a preferred embodiment of the present invention, curing of the thermosetting resin is controlled by adjusting a heating time while keeping a heating temperature constant.

In a preferred embodiment of the present invention, the shaving step and curve forming step may be concurrently carried out.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIG. 5 is a graphical representation showing temperature increase characteristics of each of a circuit board of the present invention and a conventional circuit board or relationship between a current of each of the circuit boards and a surface temperature of a through-hole conductive section;

FIGS. 7A to 7C each are a fragmentary side elevation view showing an example of a draw pin used for manufacturing a circuit board of the present invention; and FIGS. 8A and 8B each are a fragmentary sectional view showing a through-hole conductive section of a conventional circuit board.

DETAILED DESCRIPTION OF THE PREFERRED EMBODIMENTS

Now, the present invention will be described hereinafter with reference to FIGS. 1 to 7.

Figure 1:
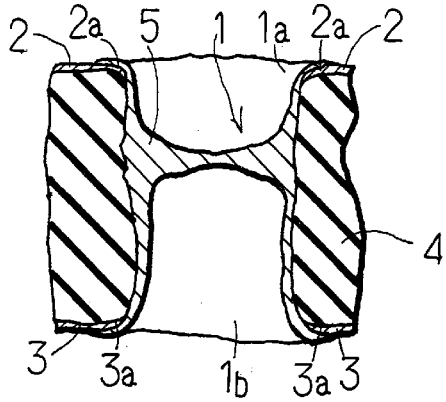
FIG. 1 is a fragmentary sectional view showing an essential part of one embodiment of a circuit board according to the present invention.

Referring first to FIG. 1, one of through-hole conductive sections formed in a circuit board according to the present invention is illustrated by way of example. In FIG. 1, reference numeral 1 designates one of through-holes formed in the circuit board by punching, 2 is front copper foil lands or copper foil lands arranged on a side of a front surface of an insulating substrate 4 of the circuit board, 3 is rear copper foil lands or copper foil lands arranged on a side of a rear surface of the insulating substrate 4, and 5 is a through-hole conductive section formed in each of the through-holes 1. The insulating substrate 4 is formed on the front surface and rear surface thereof with a front copper foil circuit including a plurality of such front copper foil lands 2 and a rear copper foil circuit including a plurality of the rear copper foil lands 3, respectively. The insulating substrate 4 may be prepared in the form of a copper-clad insulating substrate which is formed on each of both front and rear surfaces thereof with a copper foil by cladding, as conventionally seen in the art. Thus, in the illustrated embodiment, the front copper foil circuit and rear copper foil circuit each are formed by subjecting the copper foil on each of both surfaces of the copper-clad insulating substrate to etching. The insulating substrate 4 may be formed by impregnating a plurality of sheet-like paper base materials with thermosetting insulating resin such as phenolic resin or the like and then curing the thermosetting resin.

Formation of each of the through-holes 1 may be carried out by thrusting a punching pin through the insulating substrate 4 or from the front surface thereof or an upper surface thereof in FIG. 1 to the rear surface thereof or a lower surface thereof in FIG. 1. In FIG. 1, after formation of the through-holes 1, a drawing pin is inserted from a rear surface side of the insulating substrate 4 through a rear opening 1b of each of the through-holes 1 into the through-hole 1, to thereby subject an inner peripheral portion of the rear copper foil land 3 positioned on a circumference of the rear opening 1b of the through-hole 1 to curving or curve processing, resulting in the inner peripheral portion being curved.

The punching causes an inner peripheral portion 2a of the front copper foil land 2 surrounding a front opening 1a of the through-hole 1 to be curved toward an interior of the through-hole 1 and a portion of the insulating substrate 4 positioned around the front opening 1a of the through-hole 1 to be compressedly deformed. This causes the thus-curved inner peripheral portion 2a of the front copper foil land 2 to be stretched by the punching pin during the punching, resulting in being reduced in thickness thereof toward the interior of the through-hole 1. This permits the inner peripheral portion 2a of the front copper foil land 2 to be free from any sharp edge because it is curved. Likewise, an inner peripheral portion 3a of the rear copper foil land 3 surrounding the rear opening 1b of the through-hole 1 is curved toward the interior of the through-hole 1 and a portion of the insulating substrate 4 positioned around the rear opening 1b is deformed by compression. Also, the thus-curved inner peripheral portion 3a of the rear copper foil land 3 is stretched by the drawing pin, to thereby be gradually reduced in thickness toward the interior of the through-hole 1. Thus, the curved inner peripheral portion 3a of the rear copper foil land 3 is free from any sharp edge.

The through-hole conductive sections 5 each may be formed by filling a conductive paste such as a silver paint or the like in the through-hole 1 and laminatedly applying the conductive paste on the inner peripheral portions 2a and 3a of the copper foils lands 2 and 3 positioned around the front and rear openings 1a and 1b of the through-hole 1, followed by curing of the conductive paste. The conductive paste is preferably made so as to exhibit conductivity as high as possible or resistance as low as possible. The conventional circuit board described above with reference to FIGS. 8A and 8B causes the inner peripheral portion 3a of the rear copper foil land 3 to be formed with an edge, so that the portion 3a is reduced in thickness. On the contrary, the illustrated embodiment permits the inner peripheral portion of the rear copper foil land 3 to be curvedly formed, to thereby prevent a thickness of the conductive paste around the inner peripheral portion 3a of the rear copper foil land 3 from being excessively reduced. This keeps a resistance of the through-hole conductive section 5 from being excessively increased than expected and prevents a variation in resistance of the through-hole conductive section 5 from being increased.

Figure 2A:
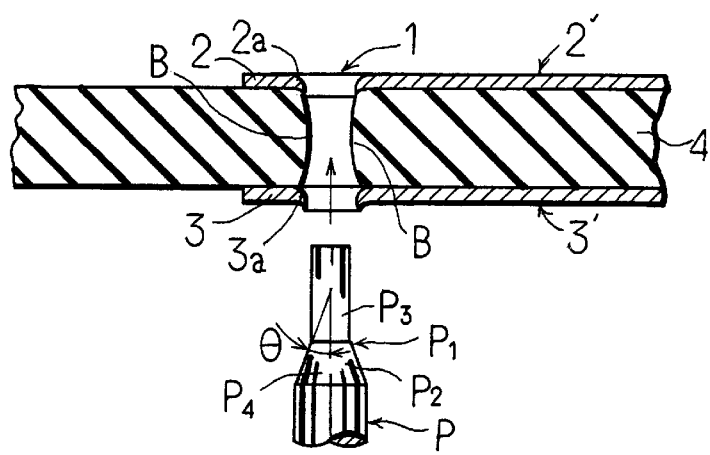
FIGS. 2A to 2C each are a fragmentary sectional view showing each of steps in manufacturing of the circuit board of FIG. 1.
Figure 2B:
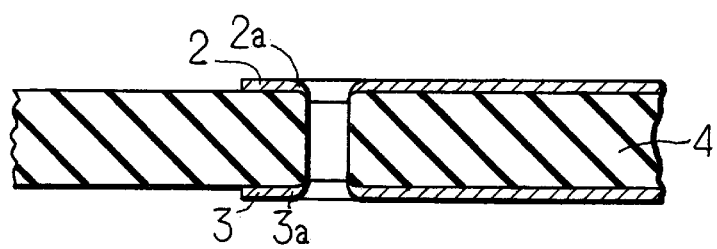
Figure 2C:
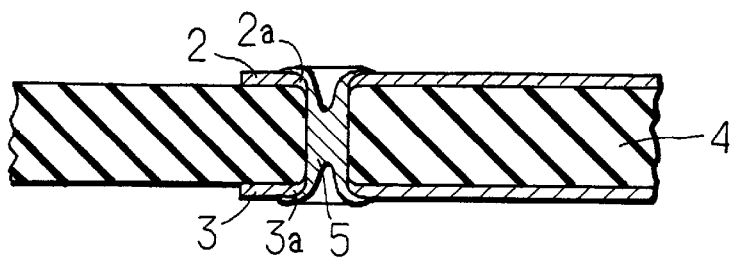

Now, manufacturing of the circuit board of the illustrated embodiment will be described hereinafter with reference to FIGS. 2A to 2C by way of example. In FIGS. 2A to 2C, the through-hole 1 is shown in a simplified configuration for the sake of brevity. FIG. 2A shows the circuit board formed with the through-holes 1. First, a commercially available copper-clad insulating substrate having a copper foil formed on each of both surfaces thereof which is made by impregnating a plurality of sheet-like paper base materials with phenolic resin to prepare the insulating substrate 4 and bonding a copper foil to each of both surfaces of the insulating substrate through an adhesive layer is prepared. Then, the copper foils on both surfaces of the insulating substrate are subject to etching to form a front copper foil circuit 2' including a plurality of the front copper foil lands 2 and a rear copper foil circuit 3' including a plurality of the rear copper foil lands 3. The insulating substrate 4 may be formed into a thickness of 0.8 to 1.6 mm and the copper foil formed on each of both surfaces of the insulating substrate 4 may be formed into a thickness of 35 $\mu$m. Then, the insulating substrate 4 is subject at portions thereof corresponding to the front copper foil lands 2 and rear copper foil lands 3 to punching by means of a punching pin such as a punch or the like, to thereby be formed with a plurality of the through-holes 1. The punching is carried out from a front surface side of the insulating substrate 4. Also, the punching results in a swell B which projects or expands toward a central axis of the through-hole 1 being formed on a central portion of the through-hole 1.

Thereafter, a drawing pin P is inserted at a distal end section P1 thereof from a rear surface side of the through-hole 1 via the rear opening of the through-hole 1 into the through-hole 1. The distal end section P1 of the drawing pin P includes a frust-conical portion P2 and a swell cutting portion P3 formed on a distal end of the frust-conical portion P2. The frust-conical portion P2 has an abutment surface P4, which is formed so as to be continuous in a circumferential direction of the frust-conical portion P2 and in a manner to be gradually decreased in diameter from a maximum diameter portion thereof of a diameter larger than a diameter of the through-hole 1 to a distal end of the portion P2. The swell cutting portion P3 is formed into a cylindrical shape having a diameter slightly smaller than a maximum diameter of the through-hole 1 formed by punching and larger than a minimum diameter thereof and a length sufficient to permit the portion P3 to cut off the swell B formed on an inner surface of the insulating substrate 4 defining the through-hole 1. Thus, when the drawing pin P is inserted at the distal end P1 thereof into the through-hole 1, the a portion of the copper foil positioned around the rear opening of the through-hole 1 or the inner peripheral portion 3a of the rear copper foil 3 is drawn into the through-hole 1 by the abutment surface P4 of the frustconical portion P2 of the drawing pin P and a peripheral surface of the swell cutting portion P3 of the drawing pin P. Concurrently, the swell cutting portion P3 cuts off the swell B of the through-hole 1. This results in the inner peripheral portion 3a of the rear copper foil land 3 being curved toward an interior of the through-hole 1, so that the swell B in the through-hole 1 may be cut off. This leads to shaping of the through-hole 1. An angle $\Theta$ defined between the abutment surface P4 and an axis of the drawing pin P is preferably set to be between 30 degrees and 60 degrees. The angle $\Theta$ and a diameter of the cylindrical portion P3 may be suitably determined depending on a material for the circuit board and dimensions thereof.

Then, as shown in FIG. 2C, a silver paint or conductive paste of $6 \times 10^{31\ 5}$ $\Omega$cm or less in specific resistance made by adding a scale-like and/or bark-like silver power material to a thermosetting resin binder made of epoxy resin is filled in the through-hole 1. More particularly, first the silver paint is coated on the front copper foil land 2 by screen printing and then a pin having an outer diameter smaller than a diameter of the through-hole 1 is repeatedly inserted into the through-hole 1 to fill the silver paint in the through-hole 1. Then, the silver paint is heated at a constant temperature of 160 to 170° C. for 1.5 hours, to thereby be cured. This results in the through-hole conductive section 5 which electrically connects the front copper foil land 2 and rear copper foil land 3 to each other therethrough being formed as shown in FIG. 2C.

Subsequently, a current of 30 mA is flowed between both ends of the through-hole conductive section 5 or between the lands 2 and 3, to thereby measure a land-land resistance or an electrical resistance between the lands 2 and 3 positioned on both ends of the through-holes 1. The land-land resistance may be 5 to 10 m$\Omega$ in average, which approaches to a resistance (1 to 3 m$\Omega$) of a through-hole conductive section formed by plating of copper. For comparison, a land-land resistance of the through-hole conductive section of the conventional circuit board shown in FIGS. 8A and 8B was measured to be 20 to 30 m$\Omega$ in average. Thus, it will be noted that the through-hole conductive section 5 in the illustrated embodiment exhibits a current capacity approaching to that of the through-hole section formed by plating.

Figure 3:
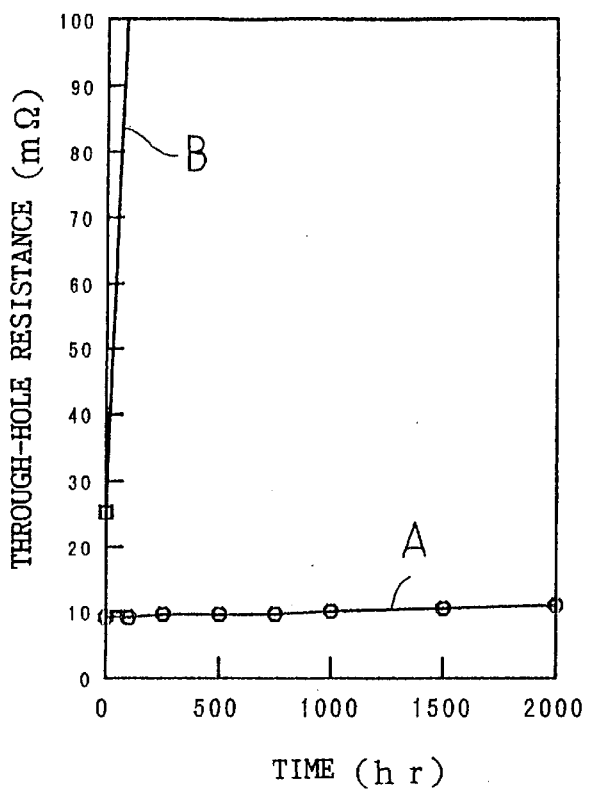
FIG. 3 is a graphical representation showing load-life characteristics of each of a circuit board of the present invention and a conventional circuit board or relationship between an operation time of each of the circuit boards and a through-hole resistance thereof.

FIG. 3 shows load-life characteristics or relationship between an operation time and a resistance of the through-hole obtained when a current of 2 A is flowed through the through-hole section of each of the circuit board of the illustrated embodiment and the conventional circuit board shown in FIG. 8 while keeping a temperature thereof at 70° C. In FIG. 3, reference character A indicates the characteristics of the circuit board of the illustrated embodiment and B indicates those of the conventional circuit board. FIG. 3 clearly indicates that the circuit board of the illustrated embodiment substantially prevents an increase in through-hole resistance as compared with the conventional circuit board.

Figure 4:
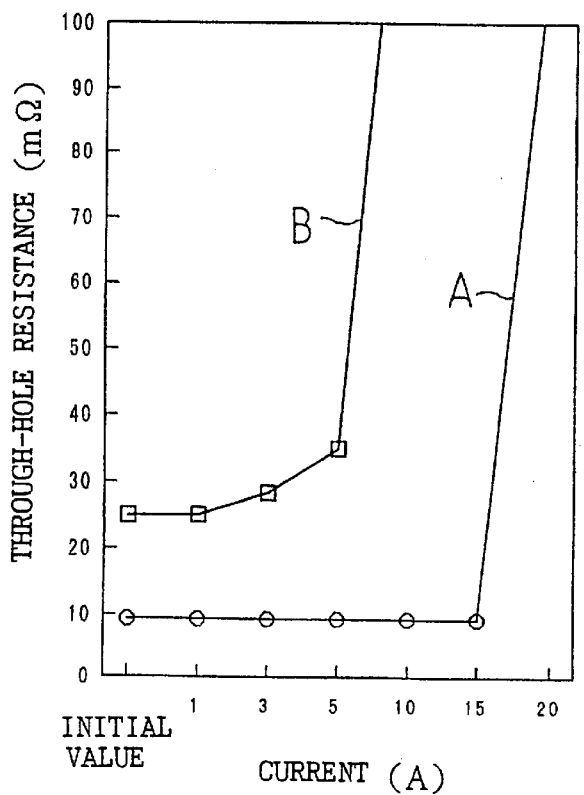
FIG. 4 is a graphical representation showing rash current characteristics of each of a circuit board of the present invention and a conventional circuit board or relationship between a current of each of the circuit boards and a through-hole resistance thereof.

FIG. 4 shows rash current characteristics or relationship between a current and a through-hole resistance measured after a pulse current having an on-time of 0.2 second and an off-time of 0.8 second is repeatedly fed hundreds of thousands of times to the through-hole conductive section of each of the circuit board of the illustrated embodiment and the conventional circuit board of FIG. 8. In FIG. 4, A and B likewise indicate the characteristics of the circuit board of the illustrated embodiment and that shown in FIG. 8, respectively. FIG. 4 likewise indicates that the circuit board of the illustrated embodiment prevents an increase in through-hole resistance as compared with the conventional circuit board.

Also, FIG. 5 shows temperature increase characteristics or relationship between a current and a surface temperature of the through-hole conductive section obtained five minutes after a current is flowed through the through-hole conductive section of each of the circuit board of the illustrated embodiment and the conventional circuit board of FIG. 8. In FIG. 5, A and B likewise indicate the characteristics of the circuit board of the illustrated embodiment and that shown in FIG. 8, respectively. FIG. 5 indicates that the circuit board of the illustrated embodiment prevents an increase in surface temperature of the through-hole conductive section as compared with the conventional circuit board.

In the illustrated embodiment, the drawing pin P is provided at the distal end thereof with the swell cutting portion P3, to thereby permit shaving or cutting-off of the swell B and curving of the inner peripheral portion 3a of the rear copper foil land 3 to be concurrently executed. Nevertheless, the shaving and curving may be carried out separately from each other.

Figure 6A:
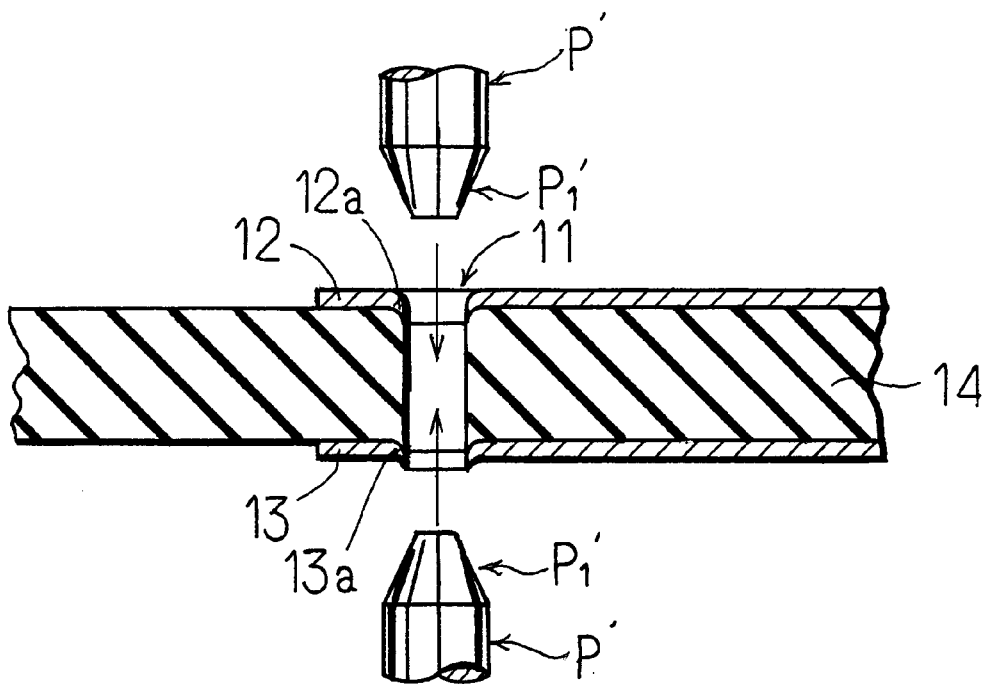
FIGS. 6A to 6C each are a fragmentary sectional view showing each of steps in manufacturing of another embodiment of a circuit board according to the present invention.
Figure 6B:
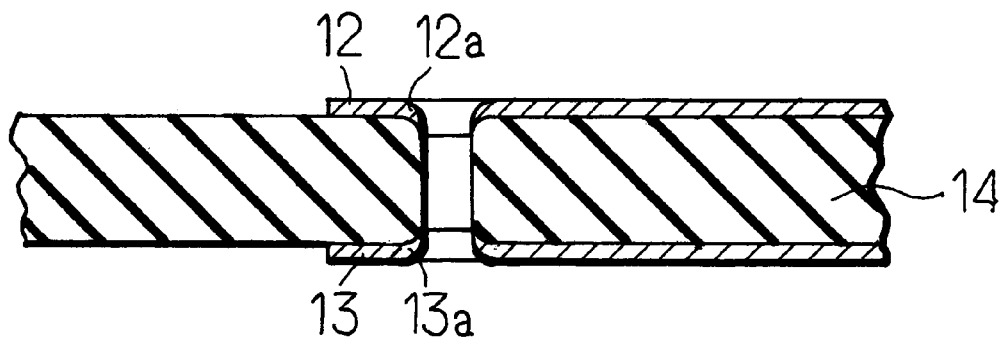
Figure 6C:
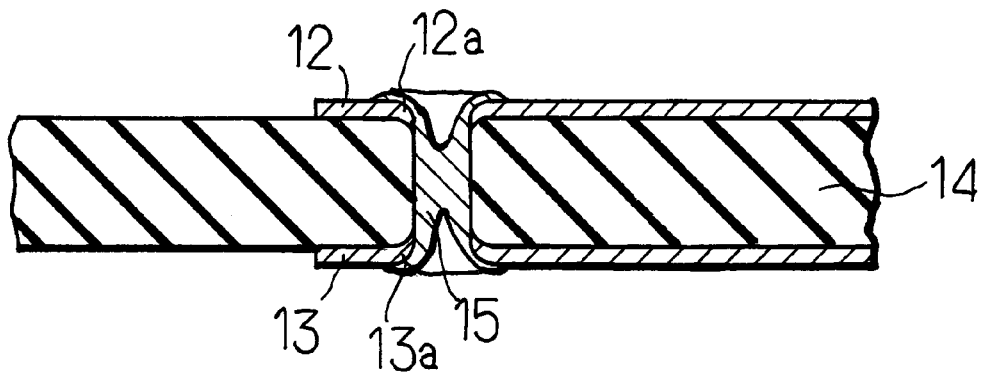

Referring now to FIGS. 6A to 6C, manufacturing of another embodiment of a circuit board according to the present invention is illustrated. First, in a circuit board of the embodiment shown in FIGS. 6A to 6C, a circuit board is made by impregnating a plurality of sheet-like paper materials with phenolic resin at an A stage, to thereby prepare a paper base material or insulating substrate 14 of 0.8 to 1.6 mm in thickness. Then, the phenolic resin is heated at a constant temperature of 80 to 100° C., to thereby be cured to a B stage and then a copper foil of 0.035 mm in thickness is laminated on each of both surface of the paper base material, resulting in preparing an uncured laminate. Then, the uncured laminate is interposed between two stainless steel plates and heated at a constant temperature of 170° C. while being pressured at 100 to 120 kg/cm$^2$ in a direction of lamination of the laminate, resulting in curing of the laminate being started. When the curing step advances to a portion of the B stage approaching to a C stage which permits an etching step subsequent thereto and more specifically 1.0 to 1.5 hours elapse after the pressurizing and heating are started, the pressuring and heating are interrupted, followed by etching of the copper foils on both surfaces of the insulating substrate, leading to formation of a circuit pattern. Thereafter, a front surface of the insulating substrate is subject to punching using a punching pin such as a punch, so that the insulating substrate is formed at each of predetermined portions thereof with a through-hole. In the example, in order to cut off or remove any swell formed due to swelling of an inner surface of the insulating substrate defining the through-hole, the punching is carried out using a first punching pin having a diameter somewhat larger than that of a provisional or green through-hole to be initially formed, resulting in a semi-processed through-hole being formed. The punching is further carried out using a second punching pin for final shaping which has the same diameter as a final through-hole desired, to thereby subject the inner surface of the semi-processed through-hole to cutting or shaving, leading to formation of a through-hole 11. In FIG. 6A, reference numerals 12 and 13 designate a front copper foil land and a rear copper foil land, respectively. Then, a pair of drawing pins P' are concurrently inserted at a distal end P1' thereof into the insulating substrate 14 from both surface sides of the insulating substrate 14 in directions opposite to each other. The distal end of the drawing pin P' used in the example is provided with only a frust-conical portion. The drawing pins P' are formed into dimensions sufficient to prevent the pins P' from abutting against each other when they are inserted into the insulating substrate 14 in directions opposite to each other. Insertion of the drawings pins P' into the through-hole 1 causes an inner peripheral portion 12a of the front copper foil land 12 and an inner peripheral portion 13a of the rear copper foil land 13 to be curved toward an interior of the through-hole 11 as shown in FIG. 6B.

Then, a silver paint made by adding a scale-like and/or bark-like silver powder material to a thermosetting resin binder made of epoxy resin is filled in the through-hole 11 as in FIG. 2C. The thermosetting resin binder has a curing temperature equal to or higher than that of the phenolic resin. In the illustrated embodiment, the silver paint is heated at a constant temperature of 160 to 170° C. for 1.5 hours, to thereby be cured. Also, the heating leads to full curing of the phenolic resin impregnated in the paper base material. This results in a through-hole conductive section 15 which electrically connects the lands 12 and 13 to each other being provided as shown in FIG. 6C. In the illustrated embodiment, the drawing pins P1 in a pair are concurrently inserted into the through-hole 11. Alternatively, they may be inserted thereinto separately from each other. Also, the drawing pin P' inserted into the through-hole 11 from a side of the front copper foil land 12 may be formed into a configuration different from that inserted from a side of the rear copper foil land 13.

The circuit board of the illustrated embodiment thus constructed was subject to a test for determining characteristics thereof. For this purpose, the circuit board of the illustrated embodiment was manufactured according to the procedure described above. Also, a circuit board manufactured by substantially repeating the above-described procedure except that drawing by the drawing pins P' did not take place was prepared for comparison. In the test, a commercially available circuit board having a copper foil laminated on each of both surfaces thereof which includes an insulating substrate made of a paper-phenol composite material and copper foils formed into a thickness of 35 $\mu$m was used. The punching and drawing were carried out under the same conditions as described above. A current of 30 mA was flowed between both ends of the through-hole of each of both circuit boards, to measure a land-land resistance or an electrical resistance between the lands 12 and 13 positioned on both ends of the through-hole. As a result, the circuit substrate for comparison had a land-land resistance of 25 mΩ and the circuit board of the illustrated embodiment had that of 5 to 10 mΩ.

In the illustrated embodiment, the shaving and curving are carried out separately from each other. Alternatively, both may be carried out concurrently. In this instance, at least one of the drawing pins is provided at the distal end thereof with a swell cutting portion, and insertion of one of the drawing pins into the through-hole via the front copper foil land and that of the other drawing pin thereinto through the rear copper foil land are separately carried out.

In the embodiments described above, the drawing pin is formed at the distal end thereof into either a combination of a frust-conical shape and a cylindrical shape or a frust-conical shape. However, the drawing pin is formed into any other suitable shape so long as it includes an abutment section which is gradually reduced in diameter from a maximum diameter section thereof continuously formed in a peripheral direction thereof and having a diameter larger than that of the through-hole to a distal end thereof. For example, the drawing pin may include a distal section constructed as shown in FIGS. 7A to 7C.

As can be seen from the foregoing, the circuit board of the present invention is so constructed that the portion of the copper foil positioned around the rear opening of the through-hole is curved. Such construction prevents a reduction in thickness of the conductive paste, to thereby reduce a resistance of the through-hole conductive section and a variation in resistance thereof. This permits a current capacity of the through-hole conductive section to be increased.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A circuit board comprising:

an insulating substrate having front and rear surfaces, said insulating substrate comprising a paper based material impregnated with thermosetting insulating resin;

a front copper foil circuit disposed on said front surface of said insulating substrate, said front copper foil circuit defining at least one front copper foil land;

a rear copper foil circuit disposed on said rear surface of said insulating substrate, said rear copper foil circuit defining at least one rear copper foil land opposite said front copper foil land; and at least one through-hole conductive section, said through-hole conductive section being formed by the process of:

thrusting a punching pin through said front copper foil land, said insulating substrate and said opposing rear copper foil land to form a through-hole, said punching pin pressing the portion of said front copper foil land surrounding the opening of said through-hole into and against the inner wall of said through-hole;

inserting a drawing pin into the opening of said through-hole in said rear copper foil land to deform by compression the portion of said insulating substrate surrounding said opening and press the portion of said rear copper foil land surrounding said opening into and against said inner wall of said through-hole; and filling said through-hole with conductive paste to form an electrical connection between said front copper foil land and said rear copper foil land through said through-hole.

2. A circuit board as defined in claim 1, wherein said conductive paste has a specific resistance of $6 \times 10^{-5}$ Ωcm or less.

3. A circuit board as defined in claim 1, wherein said thermosetting insulating resin impregnated in said paper base material is phenolic resin.

4. A circuit board as defined in claim 1, wherein each of said front copper foil circuits and rear copper foil circuits has a thickness of 30 μm or more.

5. A circuit board as defined in claim 1, wherein said front copper foil land has an inner peripheral portion arranged so as to surround a front opening of each of said through-holes and curve toward said interior of said through-holes while deforming a portion of said insulating substrate positioned around said front opening of each of said through-holes formed by compression.

* * * * *